United States Patent [19]

Obeng et al.

[11] Patent Number: 5,352,328
[45] Date of Patent: Oct. 4, 1994

[54] CONTROL OF TIME-DEPENDENT HAZE IN THE MANUFACTURE OF INTEGRATED CIRCUITS

[75] Inventors: Yaw S. Obeng; Edward J. Vajda, both of Allentown, Pa.

[73] Assignee: AT&T Bell Laboratories, Murray Hill, N.J.

[21] Appl. No.: 991,064

[22] Filed: Dec. 15, 1992

[51] Int. Cl.[5] ............ H01L 21/00; H01L 21/02; B44C 1/22; C03C 15/00
[52] U.S. Cl. ............................ 156/646; 437/225
[58] Field of Search ................ 156/646; 437/225

[56] References Cited

PUBLICATIONS

Matsushita, Processing of Compound Semiconductor Surfaces, CA98(26):226448n, 1983.
Hiari, Manufacture of Semiconductor Devices, CA114(20):197923e, 1990.

*Primary Examiner*—R. Bruce Breneman
*Assistant Examiner*—B. Everhart
*Attorney, Agent, or Firm*—Michael J. Urbano

[57] ABSTRACT

The onset of haze on silicon wafers is controlled by treating the wafers with a chemical selected from the group consisting of hot water and isopropyl alcohol and then storing the treated wafers in an inert atmosphere such as nitrogen or argon.

10 Claims, No Drawings

CONTROL OF TIME-DEPENDENT HAZE IN THE MANUFACTURE OF INTEGRATED CIRCUITS

BACKGROUND OF THE INVENTION

This invention relates to the manufacture of integrated circuits and, more particularly, to controlling the onset of time-dependent haze during such manufacture.

Haze on mirror polished surfaces of silicon wafers has been attributed to the formation of $SiO_2$ on the surface. It is postulated that $H^+$ or $OH^-$ ions diffuse into the bulk of the wafer during aqueous cleaning steps. See, T. Shiraiwa et al, ASTM 960, pp. 313-323 (1986). These diffused species slowly leach out over time (e.g., during storage) and react with $O_2$ or $H_2O$ in the ambient to fore $SiO_2$ particulates. The particulates scatter light, giving the appearance of haze. Consequently, the surface must be repolished to a specular state before the wafer can be utilized in the subsequent fabrication of integrated circuits.

Thus, a need remains in the integrated circuit art to control the onset of haze on silicon wafers so as to reduce the likelihood that the wafers have to be repolished, an extra process sequence which can be both expensive and time consuming.

SUMMARY OF THE INVENTION

In accordance with one aspect of our invention, the onset of haze on silicon wafers is controlled by treating the wafers with a chemical selected from the group consisting of hot water and isopropyl alcohol and then storing the treated wafers in an inert atmosphere such as nitrogen or argon.

DETAILED DESCRIPTION

In the manufacture of integrated circuits, silicon wafers are polished to a mirror finish by standard, well-known procedures before the circuits are actually formed on a major surface of the wafer; i.e., before the surface is patterned to form such circuits. These procedures typically include polishing the major surface of the wafer with an abrasive slurry (e.g., fine silica in an alkaline medium) and then wet chemical cleaning the surface with an acid (e.g., a sulfuric acid-hydrogen peroxide solution).

Immediately after the chemical cleaning step, the wafers have low particle or haze density (approximately $0.01/cm^2$ of particles of about 0.1–0.3 $\mu m$ diameter). However, the wafers have relatively short shelf life (half life of approximately 7 days) when stored in a clean room ambient in commercially available containers; i.e., in either unsealed black, high impact polystyrene or polypropylene boxes. These wafers tend to develop a high density of fine surface particles or haze with time, a phenomenon referred to as time-dependent haze (TDH).

One theory explaining the cause of TDH is the following. During the polishing and cleaning described above, hydrogen (atoms and/or molecules) diffuses into the bulk of the wafer to form complexes with dopant atoms. During storage of the wafers, hydrogen outgasses; that is, the trapped hydrogen is released upon the decomposition of the dopant-hydrogen complexes. The released hydrogen presumably reacts with atmospheric/ambient oxygen and/or moisture and, in one model, forms fine nodules of silica outgrowths at the silicon-air interface. The outgrowths manifest themselves as small centers which scatter light. The initial small particles presumably serve as nucleation sites for further haze growth. However, rapid thermal anneal experiments have demonstrated that the particles migrate toward colder zones on the wafer. This effect suggests that the light scattering centers are not fused to the wafer and thus cannot be silica outgrowths. We hypothesize instead that the haze is composed principally of hydrated silicates which dehydrate and detach upon heating.

In accordance with one aspect of the invention, the onset of haze on polished and cleaned silicon water surfaces is inhibited by treating the surface with either hot water or isopropyl alcohol (IPA) vapor (or both in sequential steps) and then storing the treated wafer in an inert atmosphere such as nitrogen or argon.

The water should be hot enough to remove hydrogen from the bulk of the wafer but not so hot as to be boiling. A range of 50° C.–80° C. has been found to be suitable. The time of exposure may range from about 5 to 15 minutes. For example, a hot water treatment with reverse osmosis water at 75° C. for 10 minutes has been found to be effective.

The IPA vapor treatment removes absorbed water from the wafer surface. This treatment takes place by suspending the wafers in the vapors generated by a heated IPA bath in a commercially available machine such as an Isodry-26 available from Verteq, Inc. of Anahein, Calif. The IPA itself is a standard electronic grade chemical available from Ashland Chemicals of Columbus, Ohio.

Storing the wafers should be done in a fashion which protects them from humidity and air; i.e., the wafers should be stored in an essentially oxygen-free environment. For experimental purposes, we have found that storage in a stainless steel cabinet purged with nitrogen (or argon) at about 2 SCF/hr. is effective. When such a cabinet is opened to insert or remove wafers, however, there is some risk that oxygen or water vapor may mix with the nitrogen and contaminate the wafers. Therefore, in commercial practice it may be desirable to utilize a well-known interlock chamber between the room ambient and the inert gas chamber in which the wafers are stored.

EXAMPLE

The following example describes how hot water and IPA treatments of silicon wafers followed by storage in nitrogen dramatically reduced the onset of haze.

The wafers used in these experiments were obtained from a variety of commercial vendors and then were laser scribed for identification purposes. After laser scribing, the wafers were chemically etched in a KOH solution in order to remove laser ablated debris. Although the duration of the KOH etch is short (approx 1 min.), it invariably roughens the silicon surface which then had to be repolished to return it to a specular state.

The repolishing, and subsequent cleaning, of the wafer surfaces involved a relatively standard routine: a) polishing with colloidal slurry of fine silica (about 100 angstroms in diameter) in an alkaline medium on a relatively rough (stock removal) pad; b) buffer polishing with the same slurry on a very soft buffer pad. At the end of the buffer polishing, the cycle was completed by replacing the colloidal slurry with a dilute solution of Rodelene (polyol polysiloxane hydroxyl complex in ethylene glycol; a trademark of Rodel Inc., Newark, Del.); c) rinsing off the Rodelene in a dilute Triton-X solution in deionized water; and d) chemical cleaning (with mixtures of sulfuric acid - hydrogen peroxide solutions) and scrubbing. This step is designed to remove organic films, heavy metals and particulates.

Haze was detected with a Surfscan 6200 Unpatterned Wafer Surface Contaminant Detector (Tencor Instruments, Mountain View, Calif.), with a gain of 3, maximum particle size of 10 $\mu m^2$ and a detection threshold of 0.3 $\mu m^2$.

A stainless steel cabinet purged with nitrogen at about 2 SCF/hour was used to store those wafers that were kept in an inert ambient (i.e., for comparison purposes some wafers were not stored in an inert ambient).

Hot water (75° C.) was generated in a standard clean room Teflon sink with a stainless steel immersion coil obtained from SCP Manufacturing, Boise, Id. For the hot water, post-polish treatment, wafers were immersed in hot reverse osmosis (RO) water for 10 minutes, rinsed in RO water at room temperature, and then spun dry.

The isopropyl alcohol (IPA) vapor phase, post polish treatment was done in an Isodry-26 machine.

Using this approach, we performed several experiments to confirm the effectiveness of our technique for inhibiting the onset of haze. In one experiment, we measured the mean haze counts on wafers over a 35 day period and compared the counts on the wafers on the first day with those on the 35th day.

The wafers were grouped by treatment (hot water, IPA, or no treatment) and storage conditions (room ambient, humid, or nitrogen). All wafers developed some haze during the experimental period, but the hazing was independent of the chemical composition of the holding container.

For a given post polish treatment the wafers stored in the nitrogen ambient developed haze at the slowest rate, whereas those stored in humid ambients developed haze at the fastest rate. This observation is consistent with the hypothesis that the haze development is moisture catalyzed.

The wafers treated with hot water and stored in non-humid ambients developed haze at a slower rates than either wafers treated with IPA or untreated wafers stored in the same ambients. However, the IPA treatment was still effective in slowing the rate of haze development.

These observations indicate that a combination of either a hot water or IPA treatment and storage in an inert ambient such as nitrogen enhances the shelf life of polished silicon wafers. In fact, it may be desirable in some applications to perform both treatments sequentially; e.g., a hot water treatment followed by an IPA treatment and subsequent storage in an inert ambient.

In another experiment, we measured the time evolution of TDH on untreated wafers stored in a nitrogen cabinet with those stored in a clean room ambient. For this study, 100 as-received wafers were split among three groups: (a) some were placed in a cassette in a fully boxed, unsealed container in a nitrogen cabinet, (b) others were placed only in a wafer cassette in a nitrogen cabinet, and (c) the remainder were put in a cassette in a fully boxed, unsealed container in room ambient. The containers used in groups (a) and (c) were white boxes made of polypropylene, commercially available from Empak, Inc., Chanhassen, Minn. In all three groups, the wafers were held in black cassettes made of carbon-impregnated polystyrene, commercially available from Fluoroware, Inc., Chaska, Minn.

Wafers were monitored for haze randomly for 144 days. During the experimental period the nitrogen cabinet was in normal use, i.e., the cabinet was opened and closed several times a day to insert or remove wafers.

As previously demonstrated, the wafers stored outside the nitrogen cabinet (in room ambient) developed haze rapidly, whereas those in the nitrogen ambient developed haze slowly. Comparing the wafers stored in nitrogen, those that were fully boxed showed lower haze count than those in the black cassette only. In fact, within the margin of measurement error the numerical haze count on the individual fully boxed wafers did not change over the experimental period.

We observed a one half order of magnitude difference in the haze count between the fully boxed and unboxed (cassette only) wafers in the nitrogen cabinet; this difference is indicative of the efficiency of the inert atmosphere in keeping the room air out of the cabinet. Although the nitrogen cabinet is not 100% effective in keeping out room air under shop use conditions, the data indicates that storage of the wafers in an inert ambient such as nitrogen enhances wafer shelf life. And, as noted above, the combination of a hot water or IPA treatment (or both) followed by such storage is effective in controlling the onset of TDH.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention.

What is claimed is:

1. A method of manufacturing an integrated circuit comprising the steps of:
    a) providing a silicon wafer having an unpatterned major surface,
    b) processing the wafer in a manner which tends to produce time-dependent haze on the major surface, said processing including cleaning the surface with a mixture of sulfuric acid and hydrogen peroxide,
    c) treating the surface with a chemical selected from the group consisting of hot water and isopropyl alcohol, and
    d) storing the wafer in an inert atmosphere.

2. The method of claim 1 wherein step (c) includes one step of treating the surface with hot water and another step of treating the surface with isopropyl alcohol.

3. The method of claim 1 wherein step (c) includes storing the wafer in a nitrogen atmosphere.

4. The method of claim 1 wherein step (b) includes polishing the wafer surface prior to the chemical cleaning step.

5. The method of claim 1 wherein step (c) includes treating the surface with hot water at a temperature above about 50° C. and below boiling.

6. The method of claim 1 wherein step (c) includes treating the surface with vapor phase isopropyl alcohol.

7. A method of manufacturing an integrated circuit comprising the steps of:
    a) providing a silicon wafer having a major surface,
    b) polishing the surface with a slurry,
    c) chemically cleaning the polished surface with a mixture of sulphuric acid and hydrogen peroxide, d) treating the surface with a chemical selected from the group consisting of hot water and isopropyl alcohol, e) storing the wafer in an inert atmosphere selected from the group consisting of nitrogen and argon, and f) removing the wafer from storage and performing additional processing steps toward completion of the integrated circuit.

8. The method of claim 7 wherein step (d) includes treating the surface with hot water at a temperature above about 50° C. and below boiling.

9. The method of claim 8 includes rinsing the surface with room temperature water after the hot water treatment.

10. The method of claim 7 wherein step (d) includes treating the surface with vapor phase isopropyl alcohol.

* * * * *